ial) United States Patent
Trindade et al.

(10) Patent No.: US 11,398,399 B2
(45) Date of Patent: Jul. 26, 2022

(54) COMPONENTS WITH BACKSIDE ADHESIVE LAYERS

(71) Applicant: X Display Company Technology Limited, Dublin (IE)

(72) Inventors: António José Marques Trindade, Cork (IE); Raja Fazan Gul, Cork (IE); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 47 days.

(21) Appl. No.: 16/808,251

(22) Filed: Mar. 3, 2020

(65) Prior Publication Data

US 2020/0286747 A1 Sep. 10, 2020

Related U.S. Application Data

(60) Provisional application No. 62/815,935, filed on Mar. 8, 2019.

(51) Int. Cl.
*H01L 21/683* (2006.01)
*H01L 21/50* (2006.01)
*B81C 1/00* (2006.01)
*C23C 16/455* (2006.01)
*H03H 3/08* (2006.01)
*H03H 9/64* (2006.01)

(52) U.S. Cl.
CPC ...... *H01L 21/6835* (2013.01); *B81C 1/00269* (2013.01); *H01L 21/50* (2013.01); *C23C 16/45525* (2013.01); *H01L 2221/68318* (2013.01); *H01L 2221/68345* (2013.01); *H01L 2221/68354* (2013.01); *H01L 2221/68368* (2013.01); *H01L 2221/68381* (2013.01); *H03H 3/08* (2013.01); *H03H 9/64* (2013.01)

(58) Field of Classification Search
CPC ............... H01L 21/50; H01L 21/6835; H01L 2221/68368; H01L 2221/68381; H01L 2221/68318; H01L 2221/68354; H01L 2221/68345; B81C 1/00269; B81C 1/00268

See application file for complete search history.

(56) References Cited

U.S. PATENT DOCUMENTS 7,622,367 B1 11/2009 Nuzzo et al.
7,943,491 B2 5/2011 Nuzzo et al.
(Continued)

OTHER PUBLICATIONS

Cok, R. S. et al., Inorganic light-emitting diode displays using micro-transfer printing, Journal of the SID, 25(10):589-609, (2017).

*Primary Examiner* — Aaron J Gray
(74) *Attorney, Agent, or Firm* — Choate, Hall & Stewart LLP; Michael D. Schmitt

(57) ABSTRACT

A component source wafer comprises printable components having adhesive disposed on a backside of the printable components. A wafer substrate comprises a sacrificial layer having recessed portions and anchors. A component is disposed entirely over each recessed portion. A tether physically connects each component to at least one of the anchors. A layer of adhesive is disposed on a side of the component adjacent to the recessed portion. Each component is suspended over the wafer substrate and the recessed portion defines a gap separating the component from the wafer substrate.

23 Claims, 20 Drawing Sheets

(56) References Cited

U.S. PATENT DOCUMENTS

| | | |
|---|---|---|
| 8,506,867 B2 | 8/2013 | Menard |
| 8,722,458 B2 | 5/2014 | Rogers et al. |
| 8,889,485 B2 | 11/2014 | Bower |
| 9,520,537 B2 | 12/2016 | Bower et al. |
| 10,103,069 B2 | 10/2018 | Bower et al. |
| 10,153,256 B2 | 12/2018 | Cok et al. |
| 10,157,880 B2 | 12/2018 | Bonafede et al. |
| 10,200,013 B2 | 2/2019 | Bower et al. |
| 10,224,460 B2 | 3/2019 | Bower et al. |
| 10,468,363 B2 | 11/2019 | Prevatte et al. |
| 2010/0193932 A1* | 8/2010 | Kang .................. H01L 24/19 257/690 |
| 2015/0115304 A1* | 4/2015 | Singer .................. F21V 29/70 438/27 |
| 2016/0093600 A1 | 3/2016 | Bower et al. |
| 2017/0170049 A1* | 6/2017 | Hu .................. H01L 27/156 |
| 2017/0310299 A1* | 10/2017 | Bower .................. H03H 9/0538 |
| 2017/0358717 A1* | 12/2017 | Cok .................. H01L 33/505 |
| 2020/0176286 A1 | 6/2020 | Rotzoll et al. |

* cited by examiner

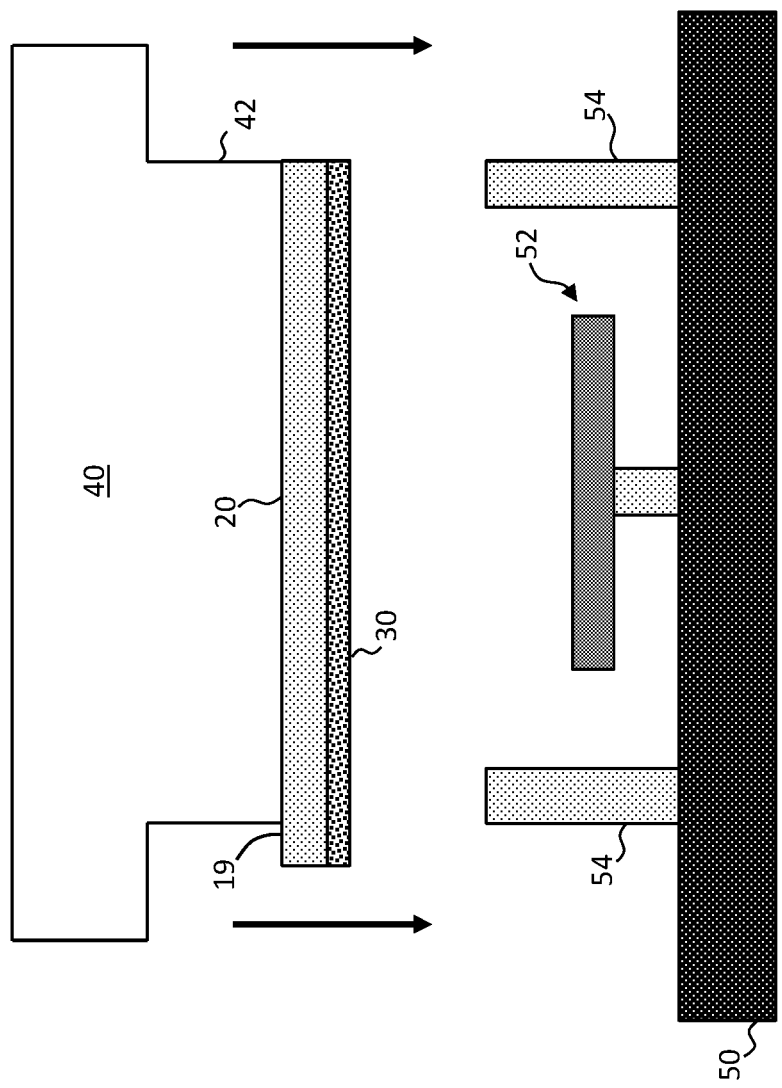

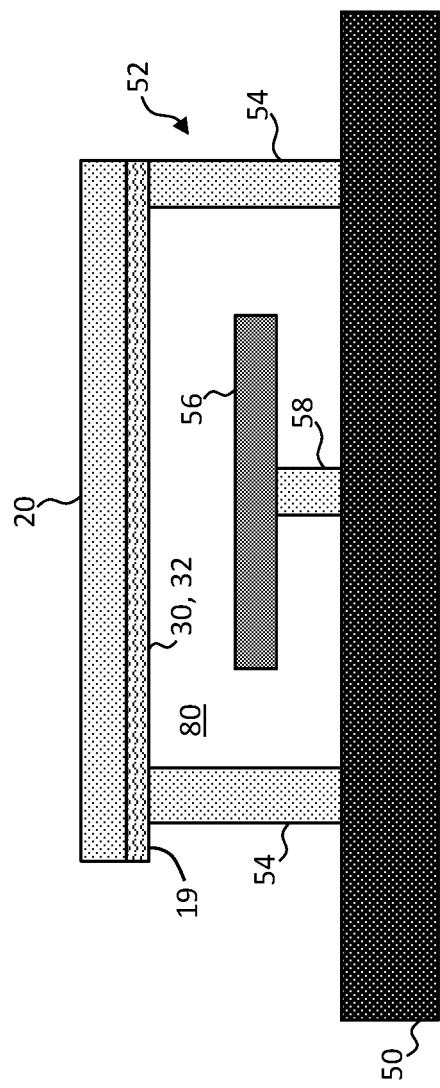

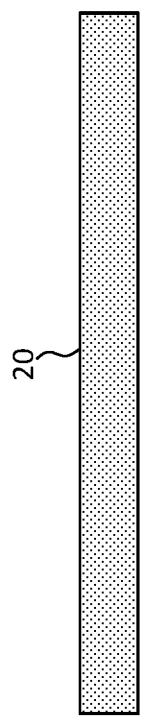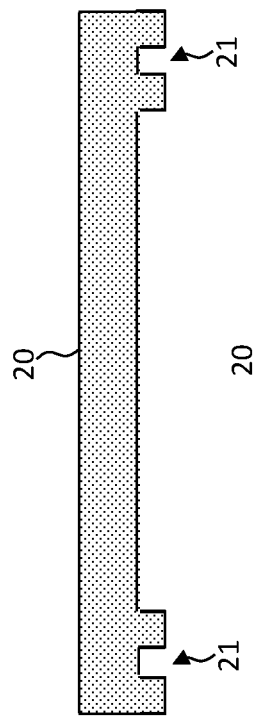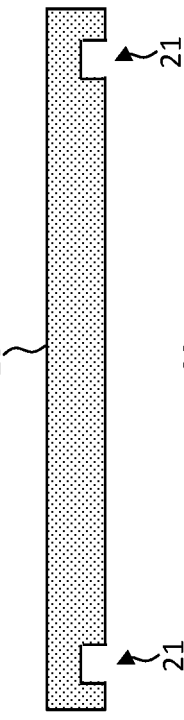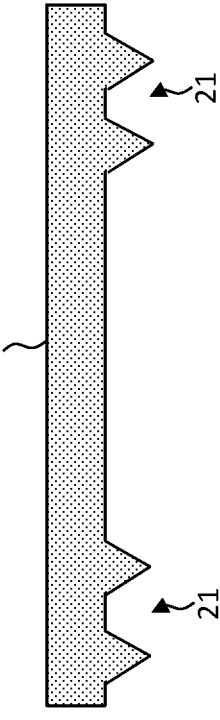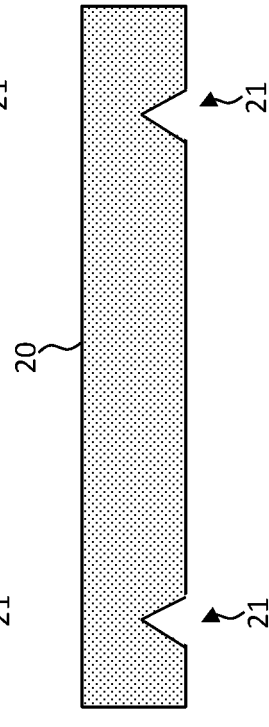

COMPONENTS WITH BACKSIDE ADHESIVE LAYERS

PRIORITY APPLICATION

This application claims the benefit of U.S. Provisional Patent Application No. 62/815,935, filed on Mar. 8, 2019, entitled Components with Backside Adhesive Layers, the content of which is hereby incorporated by reference herein in its entirety.

CROSS REFERENCE TO RELATED APPLICATIONS

Reference is made to U.S. patent application Ser. No. 16/207,738 filed Dec. 3, 2018, entitled Module Structures with Component on Substrate Post, by Rotzoll et al., the content of which is incorporated by reference herein in its entirety.

TECHNICAL FIELD

The present disclosure relates generally to printed or printable structures including components and methods for applying adhesive to such structures.

BACKGROUND

Substrates with electronically active components distributed over the extent of the substrate may be used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by sputtering or spin coating a layer of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Other methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In some applications, an adhesive layer can be provided on the destination substrate or backplane to adhere the chiplets to the destination substrate or backplane. However, the deposition or patterning of adhesive can be problematic for some transferred or receiving structures. There exists a need, therefore, for alternative methods of adhering transferred chiplets to a destination substrate or backplane.

SUMMARY

The present disclosure provides, inter alia, component source wafer structures and materials and methods for making component source wafers. The component source wafer comprises printable components having adhesive disposed on a backside of the printable components. In some embodiments, a wafer substrate comprises a sacrificial layer having recessed portions and anchors. A component is disposed entirely over each recessed portion. A tether physically connects each component to at least one of the anchors. A layer of adhesive is disposed on a side of the component adjacent to the recessed portion. Each component is suspended over the wafer substrate and the recessed portion defines a gap separating the component from the wafer substrate.

According to some embodiments of the present disclosure, the recessed portions are laterally separated by the anchors. A side of the component opposite to the recessed portion can have substantially no adhesive disposed thereon (e.g., having no intentionally present adhesive disposed thereon). The adhesive can be an uncured curable adhesive, for example that is radiation or heat curable. The adhesive can be an epoxy or resin.

According to some embodiments of the present disclosure, the component is a cap. The component can be a planar cap or a non-planar cap or can have a planar side and an opposing non-planar side. The component can comprise a notch, for example having a rectangular, triangular, or trapezoidal cross section. The component can be a microdevice.

Some embodiments of the present disclosure are directed to providing printable components with a backside adhesive layer disposed thereon and include providing a wafer substrate comprising a sacrificial layer comprising recessed portions and anchors, providing, for each of the recessed portions, a component disposed entirely over the recessed portion, wherein the component is suspended over the recessed portion by at least one tether physically connecting the component to at least one of the anchors and the recessed portion defines a gap separating the component from the wafer substrate, and disposing a layer of adhesive on a side of the component adjacent to the recessed portion.

Some methods of the present disclosure comprise providing a directional removal agent and removing adhesive exposed to the removal agent. The removal agent can be a plasma such as an $O_2$ plasma. The adhesive layer disposition can be a substantially non-directional disposition and the step of disposing an adhesive layer can comprise providing a gas, vapor, or mist of adhesive. The step of disposing the adhesive can comprise spraying the uncured adhesive or disposing the adhesive by depositing a layer of material using atomic layer deposition.

Some methods of the present disclosure comprise providing the wafer substrate comprising the sacrificial layer, wherein the sacrificial layer comprises sacrificial portions and etching the sacrificial portions to separate the components from the wafer substrate by a gap.

Some methods of the present disclosure comprise providing a stamp, contacting the one or more components with the stamp to reversibly adhere the components to the stamp, and removing the stamp and adhered components from the wafer substrate, thereby fracturing the tethers.

Some methods of the present disclosure comprise providing a destination substrate and contacting the one or more components to the destination substrate with the stamp to adhere the one or more components to the destination substrate with the layer of adhesive.

The layer of adhesive can consist essentially of uncured adhesive and some methods of the present disclosure can comprise curing the uncured adhesive after contacting the component to the destination substrate with the stamp. Some methods of the present disclosure comprise removing the stamp from the components and from the destination substrate and curing the uncured adhesive after removing the stamp.

Some methods of the present disclosure comprise curing the uncured adhesive before removing the stamp and removing the stamp from the components and from the destination substrate.

Structures and methods of the present disclosure provide, inter alia, micro-transfer printable components having adhesive coated on one side of the printable components but not on a side opposing the one coated side. Micro-transfer printing the printable components can comprise contacting the uncoated opposing side with a stamp and transferring the components to a destination substrate with the stamp. The adhesive adheres the components to the destination substrate and the stamp is removed from the components.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 5A-5L are successive cross sections of structures made according to illustrative methods of the present disclosure;

FIGS. 8A-8E are cross sections of a component according to illustrative embodiments of the present disclosure.

Figure 1:
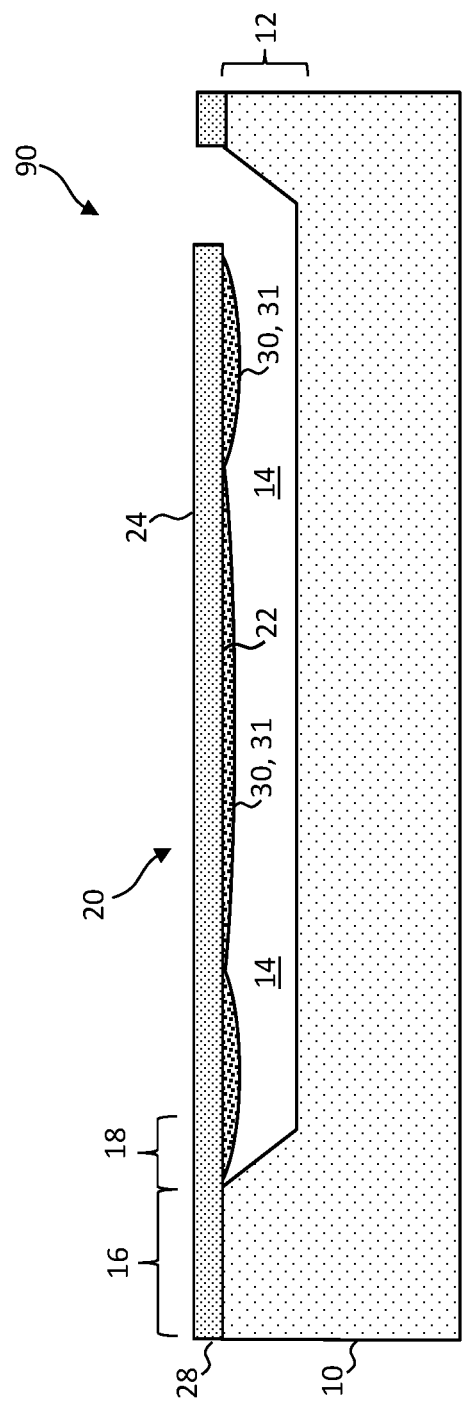
FIG. 1 is a cross section of a wafer structure according to illustrative embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Micro-electro-mechanical structure (MEMs) devices and other optical, electronic, or mechanical devices are usefully employed in cavities in integrated devices and systems. Such cavities can mechanically protect and isolate the devices from other elements of the integrated devices and systems. It is often the case that such devices are formed in materials (e.g., silicon) that are different from and process-incompatible with other materials (e.g., GaN, GaAs, or InP) and structures in the integrated devices. Thus, there is a need for integrating a variety of devices comprising a variety of materials, some of which are usefully disposed within a cavity, into an integrated device or system.

Micro-scale devices can be transferred from a native source wafer of a source material to a non-native destination substrate of a material different from the source material using contact printing, for example micro-transfer printing with a stamp. In examples of such a process, one or more micro-devices are formed on a micro-device source substrate or source wafer and undercut from the micro-device substrate, for example by etching. A stamp contacts a top side of the micro-devices opposite the micro-device source substrate to adhere the micro-devices to the stamp. The stamp and adhered micro-devices are removed from the micro-device source substrate and the stamp presses the micro-devices against a destination substrate. The micro-devices can be adhered to the destination substrate with an adhesive layer applied to the destination substrate, for example by spin coating. In some embodiments of the present disclosure, the destination substrate comprises structures disposed on a destination substrate surface that inhibit coating the destination substrate surface with the adhesive. In some such embodiments, it can be helpful to provide an adhesive on the transferred micro-device in addition to or in place an adhesive layer on the destination substrate. In some embodiments of the present disclosure, when a stamp is used to transfer the micro-devices from a source wafer, the adhesive is provided on the bottom (back) side of the micro-devices.

In some embodiments, a component 20 is a micro-scale device. In some embodiments, a component 20 is a cap. In some embodiments, a component 20 is a dielectric structure. In some embodiments, a component 20 has at least one of a width and a length no greater than 200 microns (e.g., no greater than 100 microns, no greater than 50 microns, no greater than 25 microns, no greater than 15 microns, no greater than 12 microns, no greater than 10 microns, no greater than 7 microns, no greater than 5 microns, no greater than 3 microns, or no greater than 1 micron). Components 20 can have a thickness no greater than 100 microns (e.g., no greater than 2 microns, no greater than 5 microns, no greater than 7 microns, no greater than 10 microns, no greater than 15 microns, no greater than 20 microns, no greater than 25 microns, no greater than 50 microns, or no greater than 1 microns).

Figure 2:
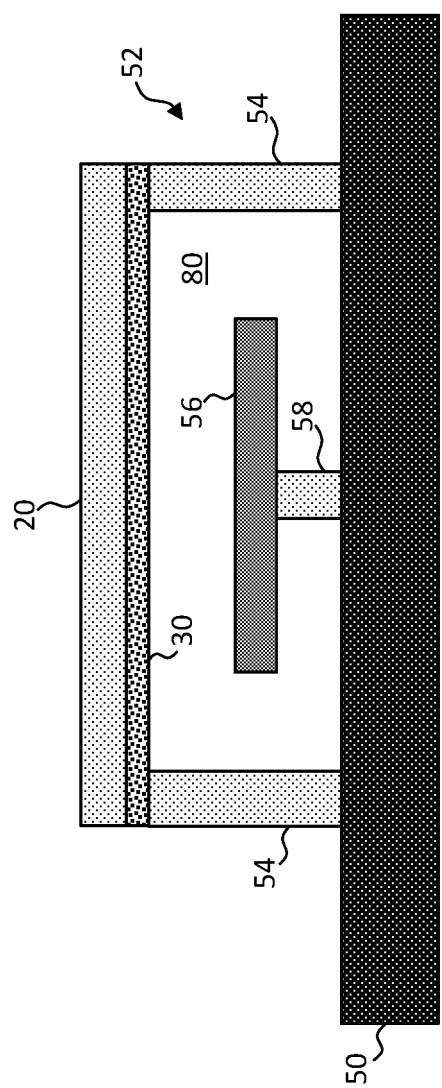
FIG. 2 is a cross section of a printed structure useful in understanding embodiments of the present disclosure.

According to some embodiments of the present disclosure, components 20 are transferred using micro-transfer printing with stamps 40 comprising stamp posts 42 (see FIG. 5E discussed below, for example) from a wafer substrate 10 (e.g., a native substrate) to a non-native destination substrate 50 (for example, as shown in FIG. 2) but are not readily transferred using conventional pick-and-place equipment, such as vacuum-assisted transfer devices or mechanical grippers. In some embodiments of micro-transfer printing, components 20 are adhered to visco-elastic stamp posts 42 by rate-dependent van der Waals forces that are not print-compatible with conventional adhesives on stamp posts 42. A conventional adhesive on stamp post 42 or top side 24 would overwhelm the rate-dependent van der Waals adhesion forces by more strongly adhering top side 24 of components 20 to stamp post 42, thereby inhibiting (e.g., preventing) separation of the components 20, thus disabling printing. Hence, in some embodiments of the present disclosure, a layer 30 of adhesive 31 is provided only on a back side 22 (bottom side) of component 20 so that top side 24 can be used for printing with a stamp post 42 employing rate-dependent van der Waals forces and layer 30 of adhesive 31 on back side 22 adheres component 20 to destination substrate 50.

Referring to FIG. 1, some embodiments of the present disclosure provide a component source wafer 90 with printable components 20 having backside 22 adhesive 31 disposed thereon. Printable components 20 are native to component source wafer 90. As shown in FIG. 1, a component 20 is disposed over a wafer substrate 10. Wafer substrate 10 comprises a sacrificial layer 12 having recessed portions 14 and anchors 16 (for simplicity only one recessed portion 14 and anchor 16 is shown). Recessed portion 14 defines a gap (between wafer substrate 10 and component 20). Recessed portions 14 can be formed by etching sacrificial material within sacrificial portions of sacrificial layer 12 corresponding to recessed portions 14. The sacrificial portion is etched before disposing layer of adhesive 30. Therefore, before etching, sacrificial layer 12 is in contact with component backside 22. Anchors 16 can be disposed beneath component 20 (no shown) or disposed laterally between recessed portions 14 so that recessed portions 14 are laterally separated by anchors 16, as shown in FIG. 1. Component 20 is disposed entirely and directly over recessed portion 14 so that all of component 20 is directly above recessed portion 14 in a direction orthogonal to a surface of wafer substrate 10 and no portion of component 20 is laterally offset from recessed portion 14. Each of one or more component tethers 18 physically connects each component 20 to wafer substrate 10 by at least one anchor 16. A layer 30 of uncured adhesive 31 is disposed on a back side 22 of component 20. Back side 22 (also referred to as a bottom side) is adjacent to recessed portion 14 and source component wafer 10 and opposite a top side 24 of component 20. Top side 24 is on a side of component 20 opposite wafer substrate 10.

Recessed portions 14 define an exposed gap between component 20 (and back side 22) and wafer substrate 10 so that component 20 is suspended over wafer substrate 10 (e.g., by component tether 18). By exposed, it is meant that recessed portions 14 have a means of egress for etchants that remove any material in sacrificial portions of sacrificial layer 12 and a means of ingress for adhesive 31 (e.g., as described further below). Layer 30 of adhesive 31 can be substantially disposed only on back side 22 of component 20 and substantially absent from top side 24. By substantially absent it is meant that any adhesive 31 disposed on top side 24 of component 20 does not inhibit the micro-transfer process for components 20 from wafer substrate 10 to destination substrate 50 (e.g., as shown in FIG. 2). In some embodiments, top side 24 of component 20 does not intentionally have any adhesive 31 disposed thereon and, therefore, top side 24 is substantially absent of adhesive 31. Adhesive 31 in layer 30 can be an uncured curable adhesive 31 that can be cured, for example with radiation 74 (e.g., ultraviolet radiation, as shown in FIG. 5K) or heat. Such adhesives 31 can be or include, for example, epoxy, resin, or other organic materials. Components 20 can be transparent to radiation 74 that is used to cure adhesive 31 (e.g., can comprise suitable dielectric material(s)).

Referring to FIG. 2, destination substrate 50 comprises one or more cavity structures 52 that inhibit the deposition of adhesive 31 on a surface of destination substrate 50. For example, destination substrate 50 can comprise a cavity structure 52 including a piezo-electric device 56 disposed on a cavity post 58 and surrounded by one or more cavity walls 54 within a cavity 80. One or more cavity walls 54 can form a cube, elongated cube, or cylinder, for example, or have a cross section that forms a rectangle, polygon, or a combination of curved and straight-line segments, for example. Cavity structures 52 can inhibit deposition of an adhesive layer 30, for example if deposited by spin or spray coating. In some embodiments of the present disclosure, a deposited adhesive 31 could undesirably coat cavity structures 52 and render them less functional (e.g., adhesive 31 on piezo-electric device 56 can disturb operation of piezo-electric device 56) or cavity structures 52 cannot be readily coated with an adhesive 31 as desired (e.g., cavity walls 54 cannot be exclusively coated with an adhesive 31 to adhere component 20 to cavity walls 54).

According to some embodiments of the present disclosure, cavity 80 can significantly mechanically isolate one or more cavity structures 52 within cavity 80 and enable the consistent and effective independent operation of structures disposed in cavity 80. Thus, according to some embodiments of the present disclosure, one or more cavity structures 52 are provided within cavity 80, where a cavity floor (e.g., destination substrate 50), cavity walls 54, and a cap (e.g., component 20) are adhered to one or more cavity walls 54 with layer 30 of adhesive 31 form cavity 80. In some embodiments of the present disclosure, component 20 is a cap for cavity 80. As used herein, component 20 can be a cap that is a structure that covers or is constructed (e.g., sized and shaped) to cover cavity 80. In some embodiments, component 20 is a cap that can be adhered to one or more cavity walls 54 or substrate 50 to provide protection from environmental contaminants. A cap can comprise one or more materials such as a dielectric material.

According to some embodiments of the present disclosure, a layer 30 of adhesive 31 is applied to component 20 instead of to destination substrate 50 (e.g., because destination substrate 50 comprises a structure that inhibits the application of adhesive). Because micro-transfer printing can use visco-elastic stamps 40, adhesive applied to top side 24 of component 20 will undesirably adhere component 20 to stamp post 42 so that component 20 will not release from stamp 40 when component 20 is pressed against destination substrate 50 (e.g., a structure (e.g., cavity structure 52) included in destination substrate 50). Therefore, according to embodiments of the present disclosure, adhesive 31 is substantially present only on back side 22 (bottom side) of component 20.

As shown in FIG. 1, component tethers 18 are laterally separated by and adjacent to anchors 16 and recessed portions 14. In some embodiments (not shown), component tethers 18 are disposed beneath components 20 within recessed portion 14 and anchors 16 are beneath component tethers 18.

Figure 3:
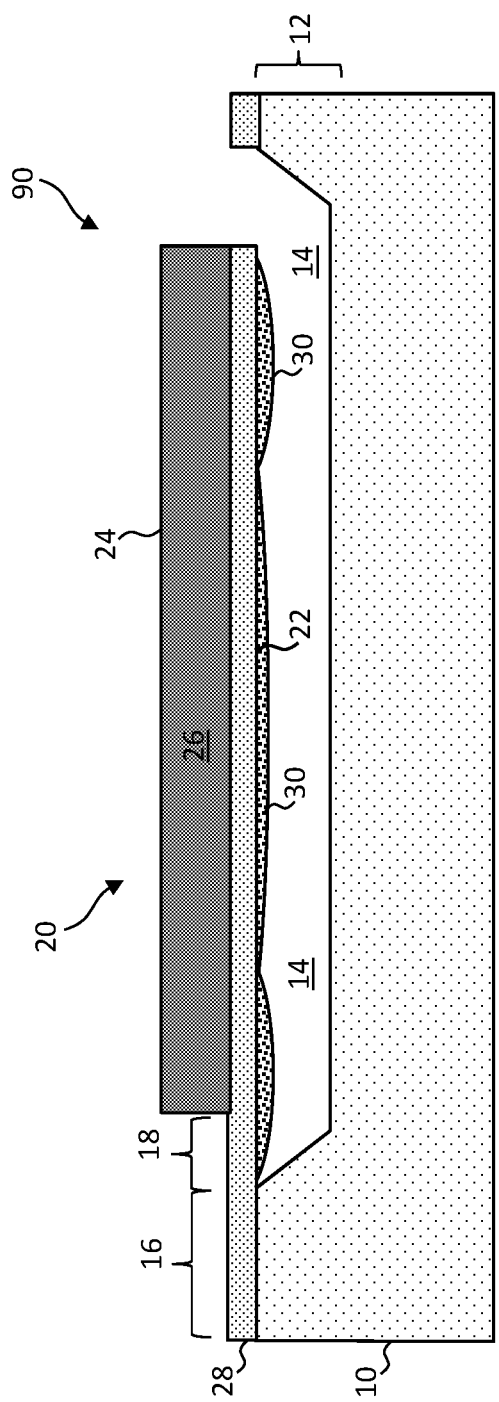
FIGS. 3 and 4 are cross sections of multi-element components according to illustrative embodiments of the present disclosure.
Figure 4:
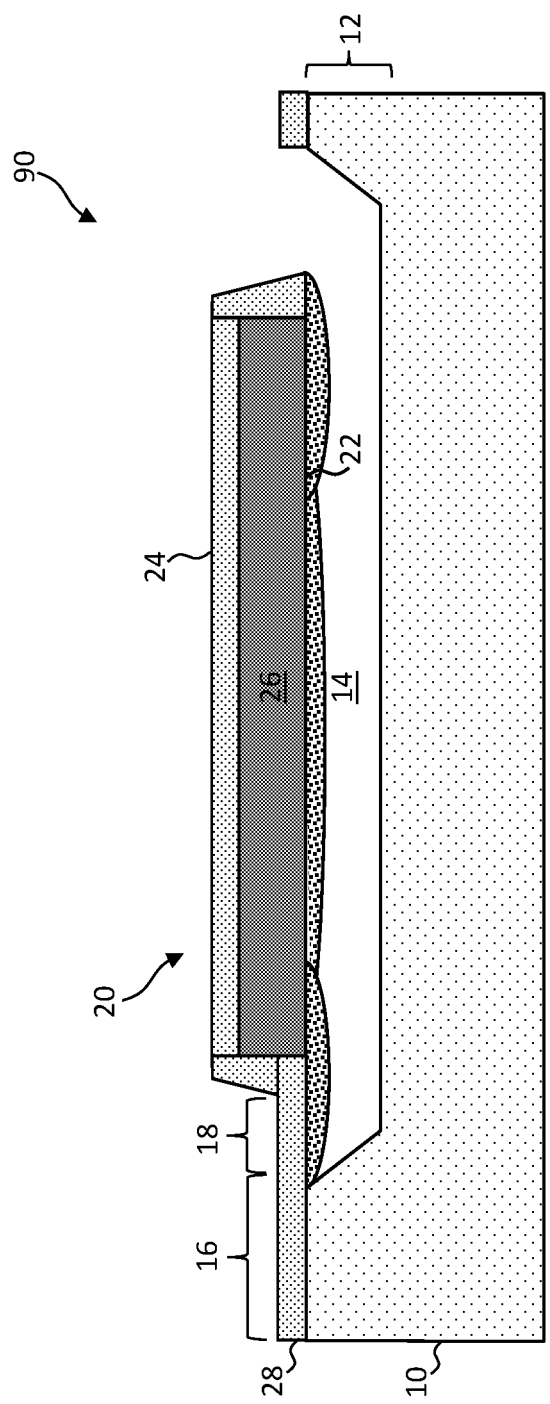

Referring to FIGS. 3 and 4, according to some embodiments of the present disclosure, component 20 comprises multiple elements including, for example, one or more active elements 26 such as a semiconductor structure and, optionally, one or more passive elements 28, such as a dielectric layer or electrical conductor. Any one or more of the multiple elements can be attached to at least a portion of component tether 18, for example a dielectric layer can form a substrate for active element 26 that is attached to component tether 18 (e.g., as shown in FIG. 3) or a dielectric layer can form an encapsulating layer for active element 26 that is attached to component tether 18 (e.g., as shown in FIG. 4).

Figure 5A:
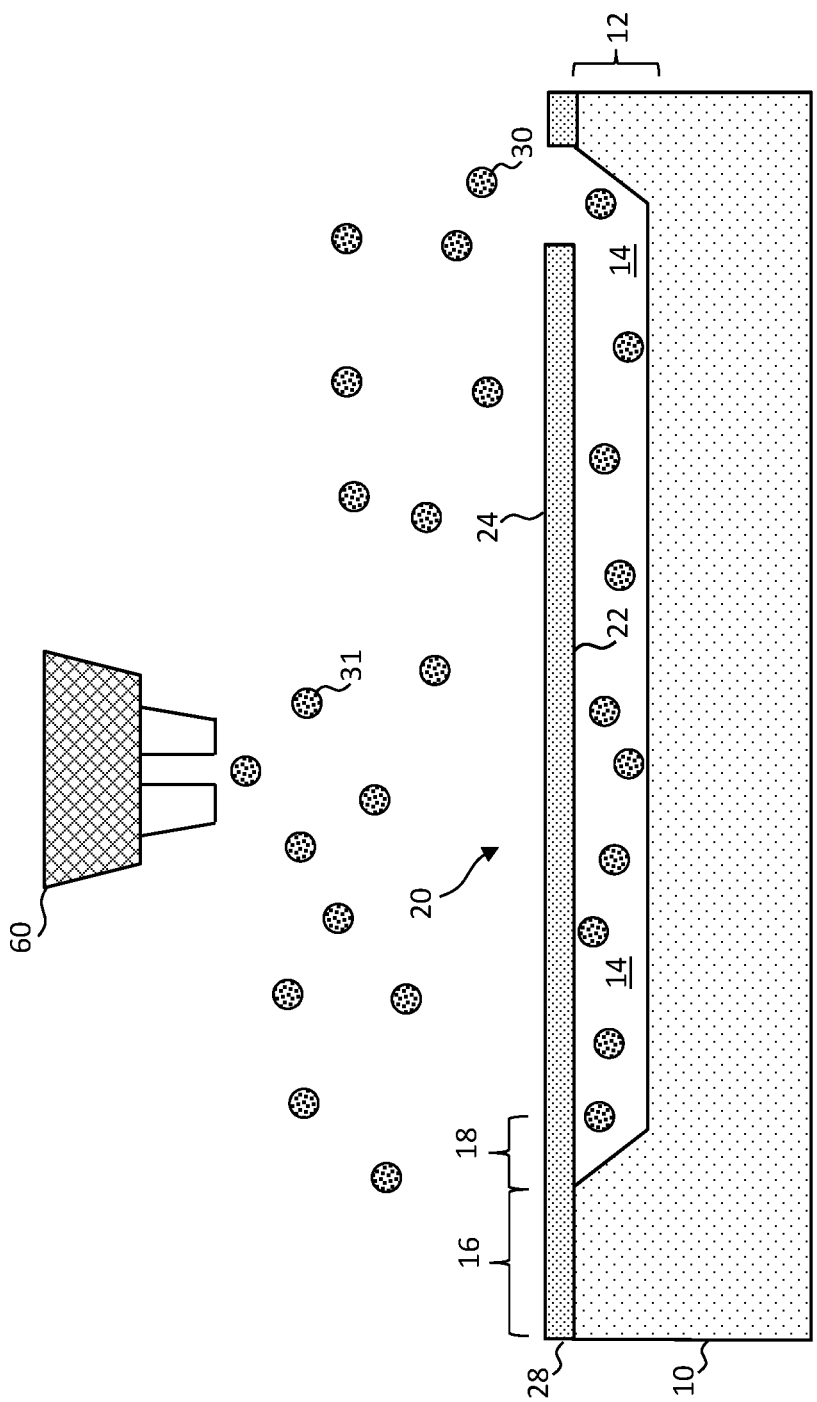
Figure 5B:
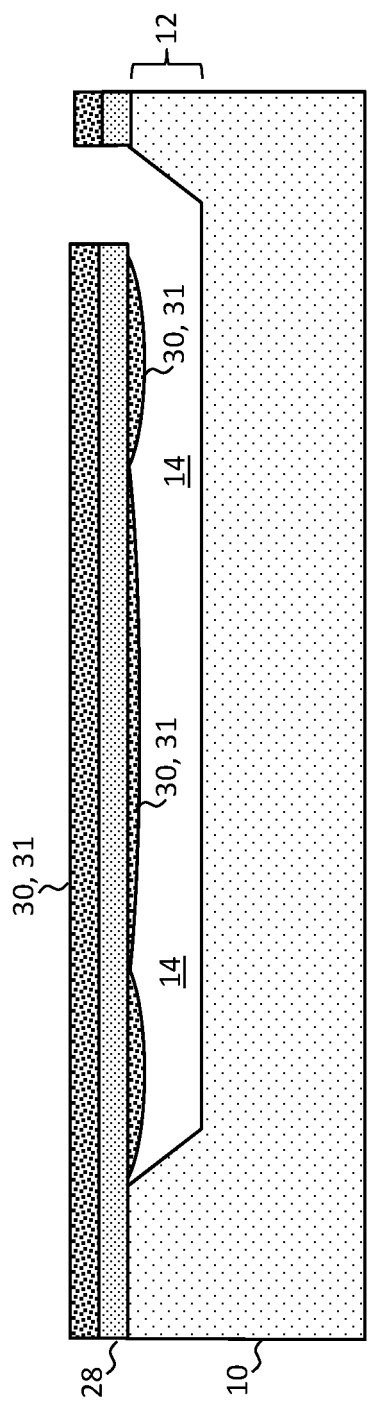
Figure 5C:
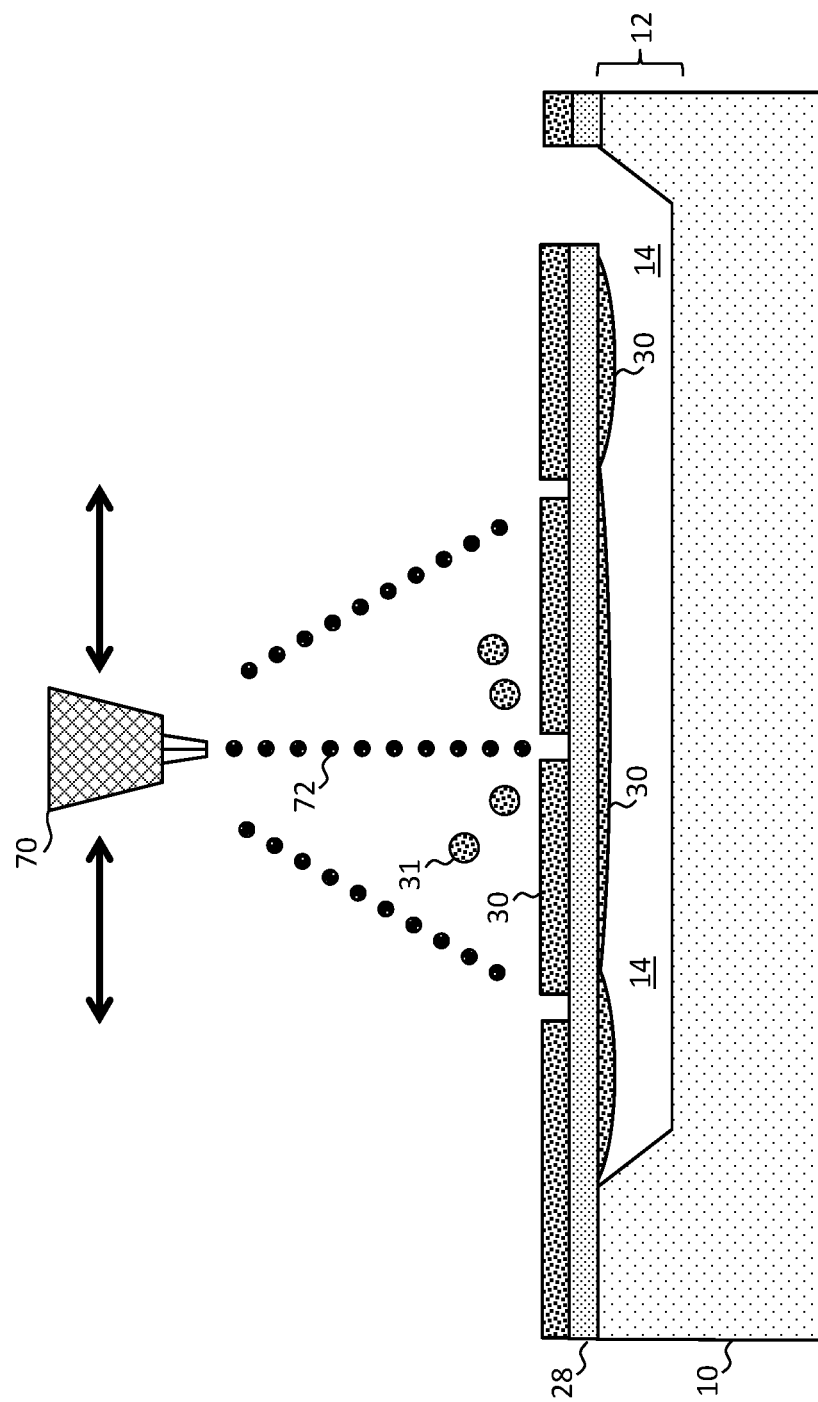
Figure 5D:
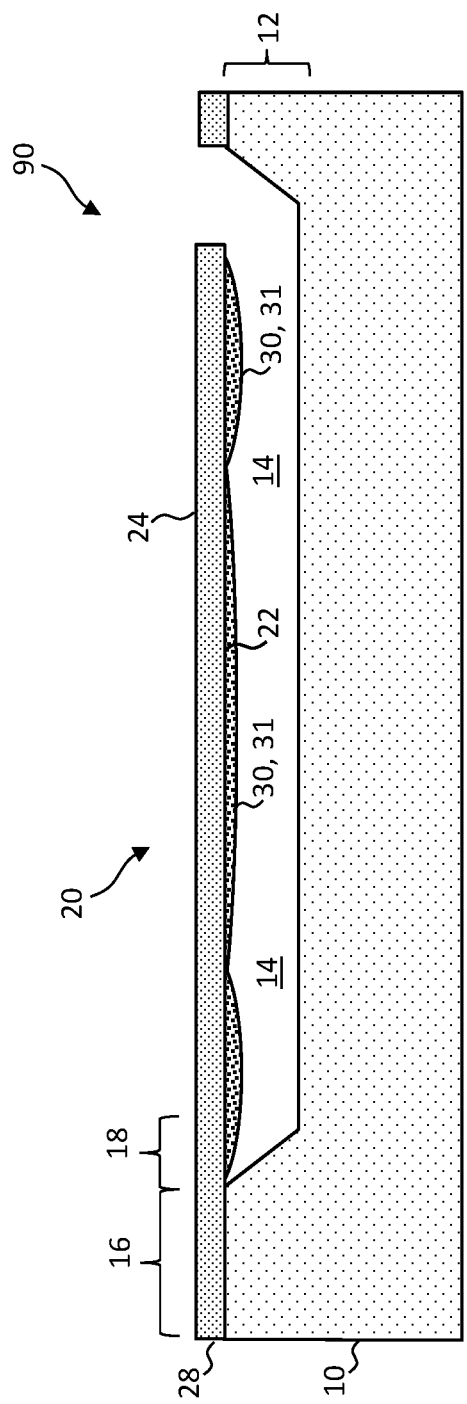
Figure 5E:
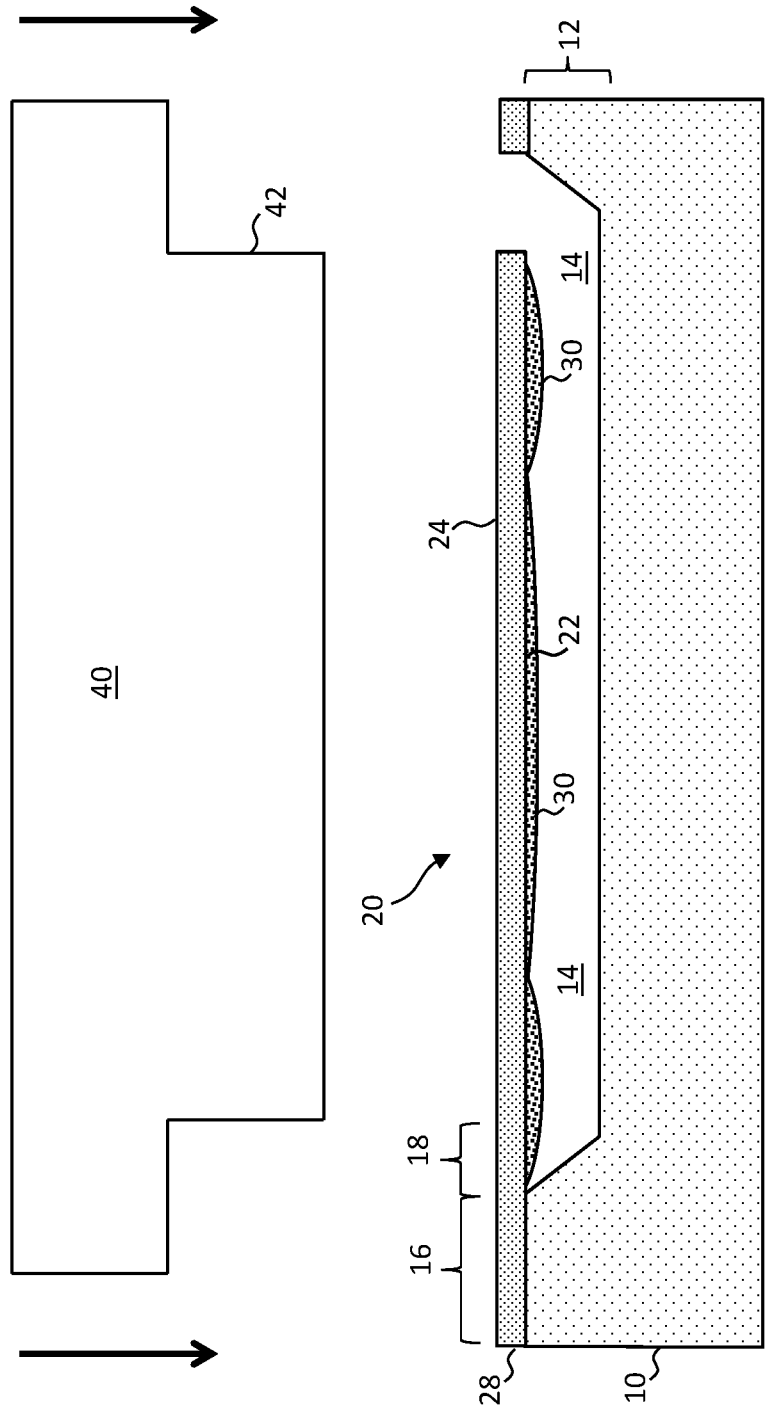
Figure 5F:
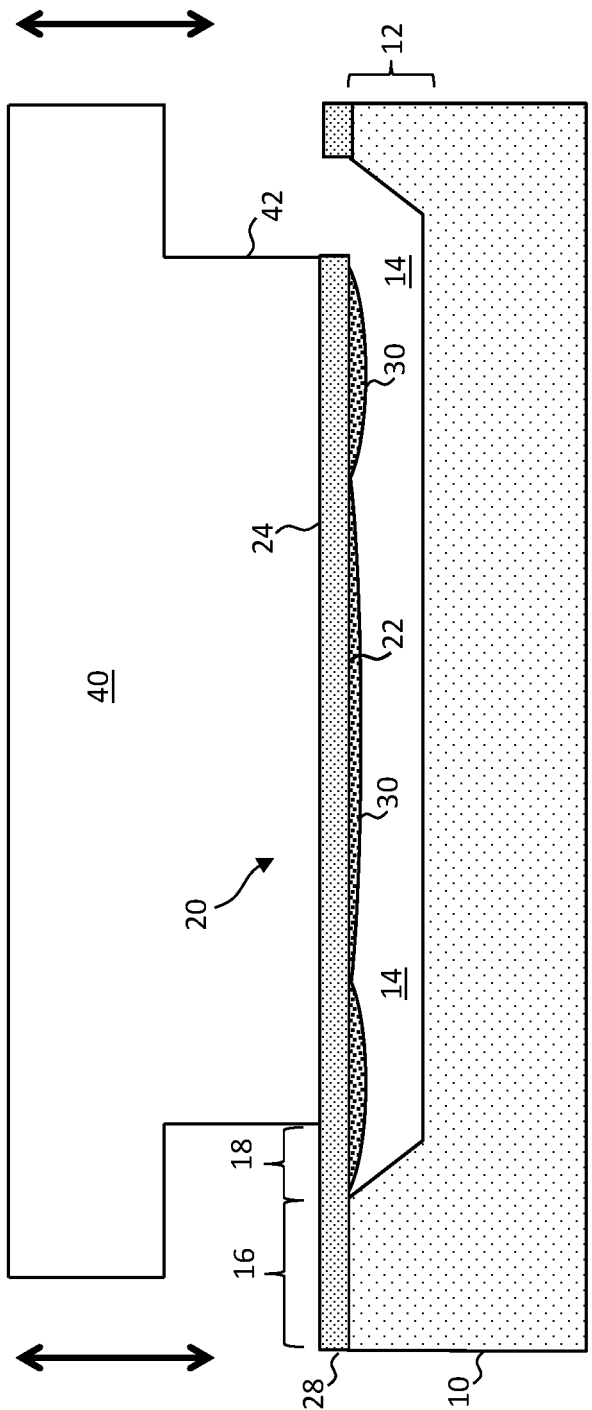
Figure 5G:
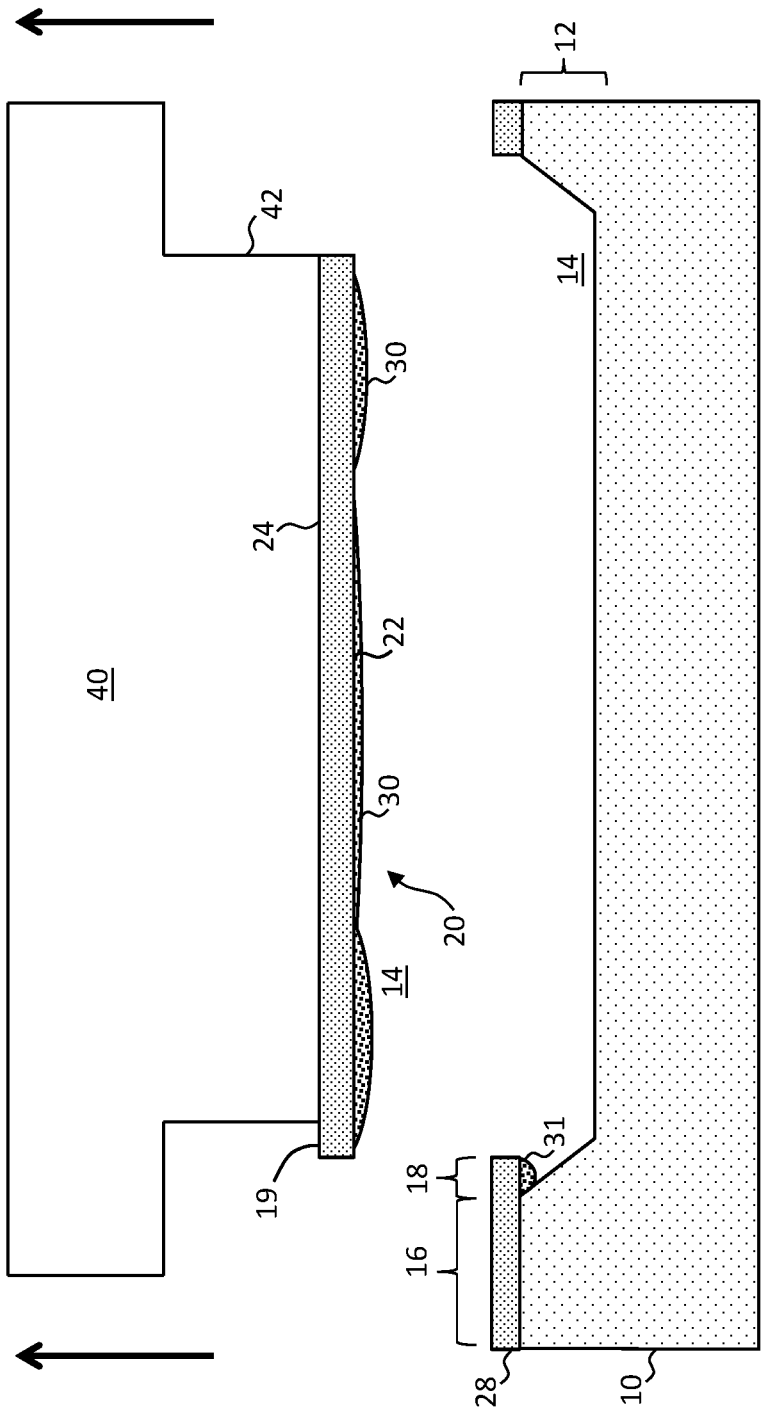
Figure 5I:
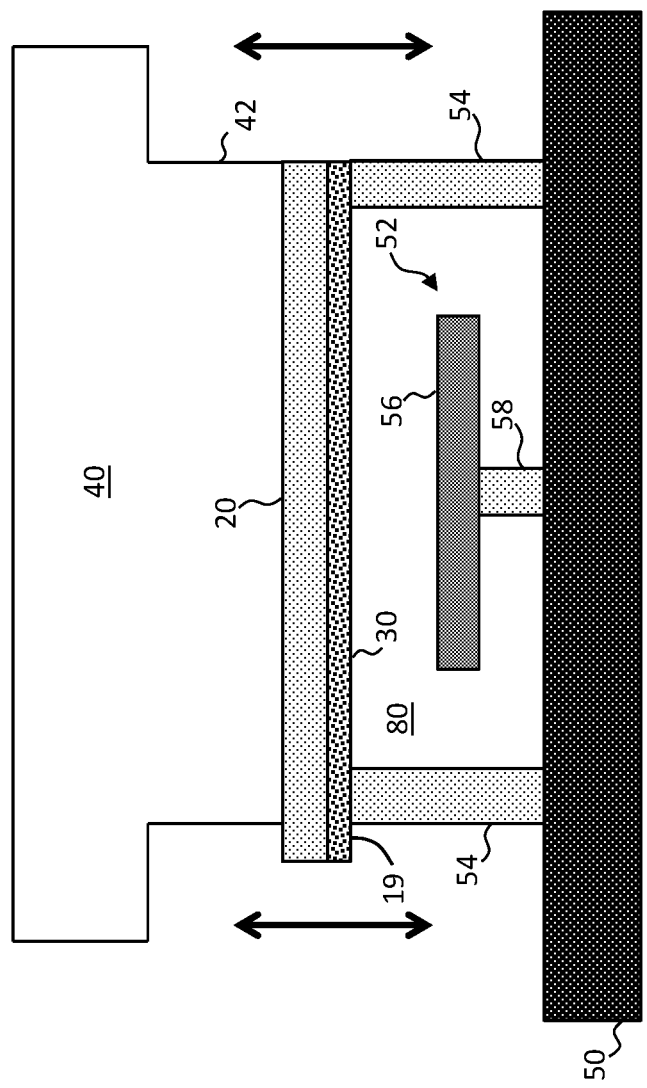
Figure 5J:
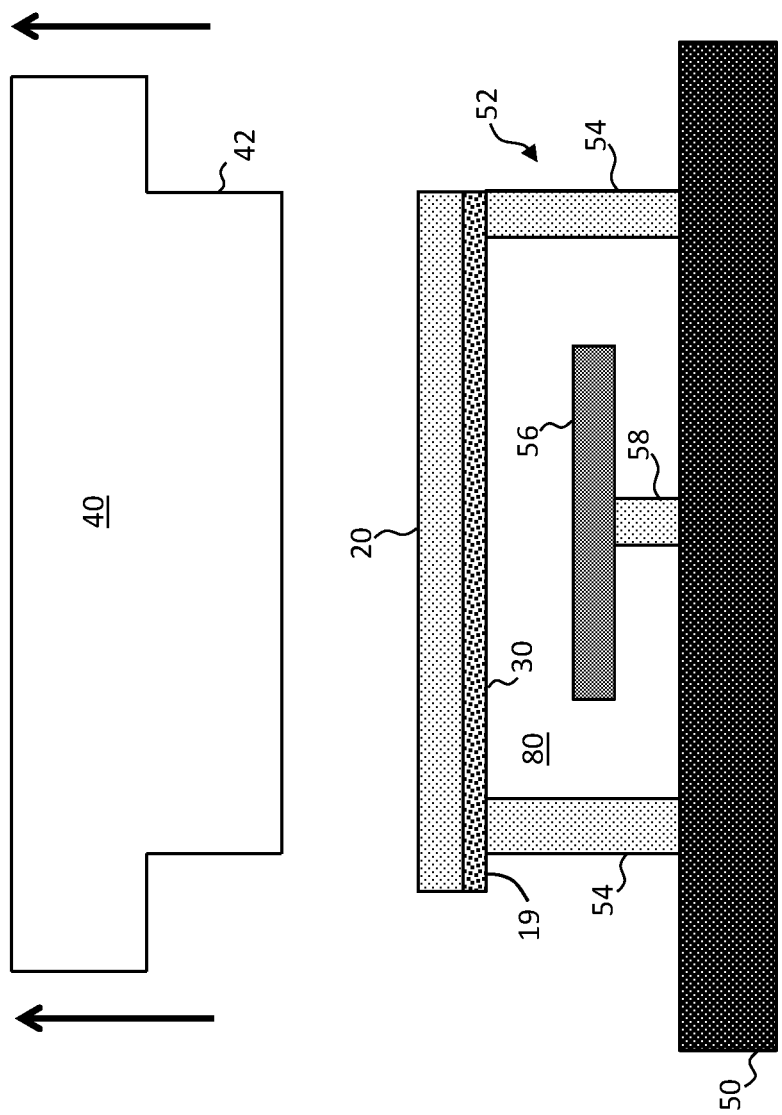
Figure 5K:
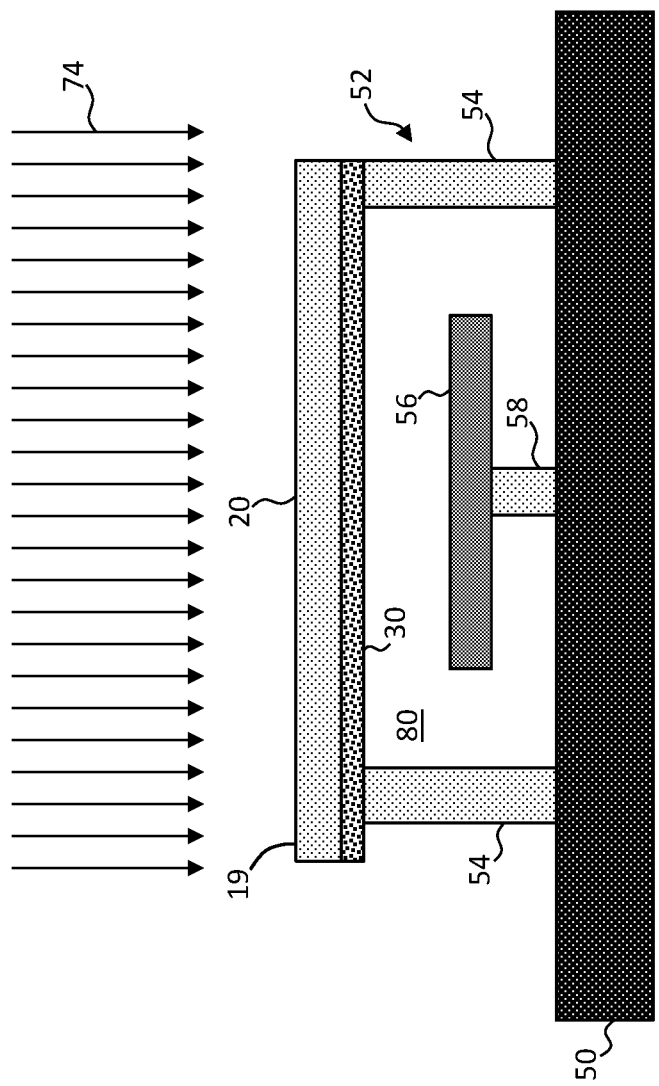
Figure 6:
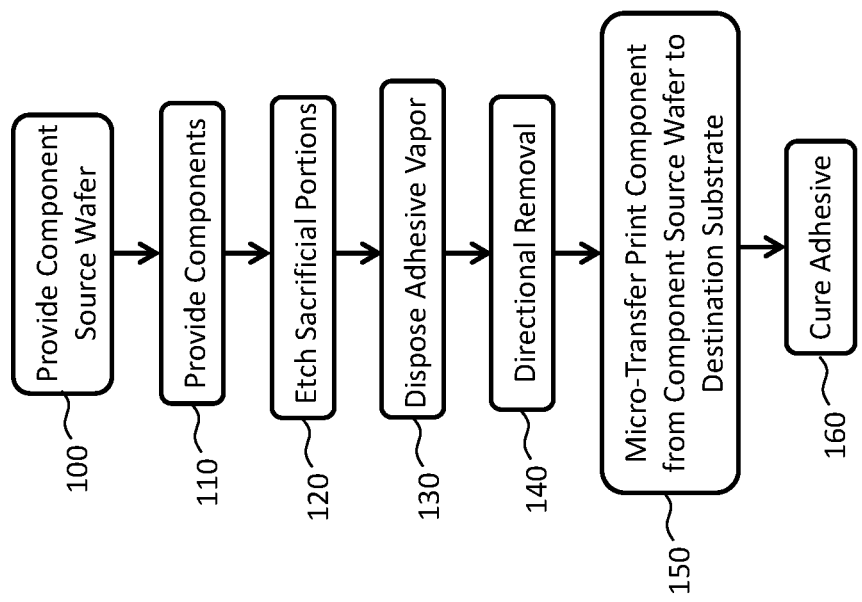
FIG. 6 is a flow diagram illustrating methods of the present disclosure and corresponding to FIGS. 5A-5L.

Referring to FIGS. 5A-5L, which illustrate successive structures formed in methods according to the flow diagram of FIG. 6, a method of making a back side adhesive structure 90 comprises providing a wafer substrate 10 comprising a sacrificial layer 12 having recessed portions 14 and anchors 16 in step 100. A component 20 is disposed entirely and directly over each recessed portion 14 in step 110. Recessed portion 14 defines a gap between component 20 and wafer substrate 10 so that component 20 is suspended over wafer substrate 10 by a component tether 18 physically connecting each component 20 to at least one anchor 16. A layer 30 of adhesive 31 is disposed on a side (e.g., back side 22) of component 20 adjacent to recessed portion 14 and wafer substrate 10.

Wafer substrate 10 can be any useful wafer available, for example in the photolithographic, integrated circuit, or display industries, for example semiconductor, compound semiconductor, sapphire, ceramic, glass, polymer, or other wafers or substrate materials. Components 20 can be constructed using photolithographic processes and methods and can comprise active or passive materials (e.g., active elements 26 or passive elements 28) such as semiconductors (e.g., any combination of silicon, GaN, GaAs), piezo-electric materials (such as lead zirconate titanate (PZT) or potassium sodium niobate (KNN)), dielectrics (e.g., SiO2, SiN, polymers, resins, epoxies), or conductors (such as metals or conductive oxides) in any useful structure such as any one or combination of an integrated circuit, a computer chip, an LED, a sensor, a light conductor, a mechanical structure, an optical structure, an electronic structure, or a planar or 3D dielectric structure. Anchors 16 can be designated portions of wafer substrate 10 to which component tethers 18 are physically attached. A sacrificial portion of sacrificial layer 12 can be any material differentially etchable from wafer substrate 10 and component 20 (such as an oxide material in a semiconductor substrate) or an anisotropically etchable portion of wafer substrate 10 (e.g., crystalline silicon 111).

Referring to step 120 of FIG. 6, sacrificial portions of sacrificial layer 12 are etched to form recessed portions 14 (defining gaps) and component tethers 18 suspending components 20 over component substrate 10, for example resulting in the structure illustrated in FIG. 1.

Referring to FIG. 5A, in step 130 an adhesive 31 is disposed on back side 22 of component 20, for example by using a spray coater 60 that forms a mist, spray, gas, or vapor of adhesive 31. For example, SU-8 can be provided in a gas carrier or aerosol. As another example, organic materials can be provided using atomic layer deposition. Spray coater 60 can provide a substantially non-directional plume of adhesive 31, e.g., provides a volume deposition as in chemical vapor deposition. A substantially non-directional vapor or plume of adhesive is one that can adhere to any exposed surface, including top side 24 and back side 22 of component 20, as shown in FIG. 5B. Layer 30 of adhesive 31 can form an unpatterned layer or a patterned layer and can be regular (as shown on top side 24 of component 20 of FIG. 5B) or irregular (as shown on back side 22 of component 20 in FIG. 5B) or can be entirely absent in some portions of any surface (forming a patterned layer 30 of adhesive 31).

Referring to FIG. 5C, in step 140 adhesive 31 is substantially removed from top side 24 of component 20 by a directional removal agent for example a plasma 72 emitted from plasma source 70 that provides line-of-sight deposition, for example sputtering with gas ions. Plasma source 70 (or wafer substrate 10) can be physically moved to ensure that all of top side 24 of component 20 is exposed and any adhesive 31 is substantially removed or can emit plasma 72 in all necessary directions (e.g., at a wide angle) to substantially remove adhesive 31 from top side 24 of component 20. FIG. 5D illustrates back side adhesive structure 90 after any undesirable adhesive 31 is removed. (Note that FIG. 5D is similar to FIG. 1.)

Referring to FIG. 5E, once the undesirable adhesive 31 is substantially removed from top side 24 of component 20, component 20 can be micro-transfer printed from wafer substrate 10 to destination substrate 50 in step 150, for example by pressing and contacting stamp post 42 of stamp 40 (e.g., comprising a visco-elastic material) to top side 24 of component 20 (e.g., as shown in FIG. 5F) to adhere component 20 to a distal end of stamp post 42 with van der Waals forces, removing stamp 40 from wafer substrate 10 (shown in FIG. 5G) with component 20 adhered to a distal end of stamp post 42, thereby fracturing or separating component tether 18 to form fractured or separated component tether 19, and transporting stamp 40 and adhered component 20 to destination substrate 50, as shown in FIG. 5H. Referring to FIG. 5H, destination substrate 50 includes cavity structure 52 that includes cavity post 58 and piezoelectric device 56 (as labelled in FIG. 5I). Components 20 removed from wafer substrate 10 are said to comprise at least a portion of a component tether 18 or comprise a fractured or separated component tether 18. Stamps 40 can be controlled by opto-mechatronic motion platform systems with electronic control of mechanical systems and optical alignment.

Destination substrate 50 can comprise one or more cavity structures 52 (e.g., formed thereon). Referring to FIG. 5I, stamp 40 is moved to contact layer 30 of adhesive 31 on component 20 to destination substrate 50 or any structure or structures (e.g., one or more cavity walls 54) and adhere component 20 to destination substrate 50 or the structure or structures. This step can be done in the presence of a desired atmosphere, for example vacuum, dry air, nitrogen, or other desired gas or liquid to be enclosed within cavity 80. As shown in FIG. 5J, stamp 40 can be removed from destination substrate 50, providing an integrated cavity 80 with a cap (component 20), cavity walls 54, and a cavity floor (surface of destination substrate 50), and any desired cavity structures 52 in cavity 80 (e.g., piezo-electric device 56 and cavity post 58).

Figure 7:
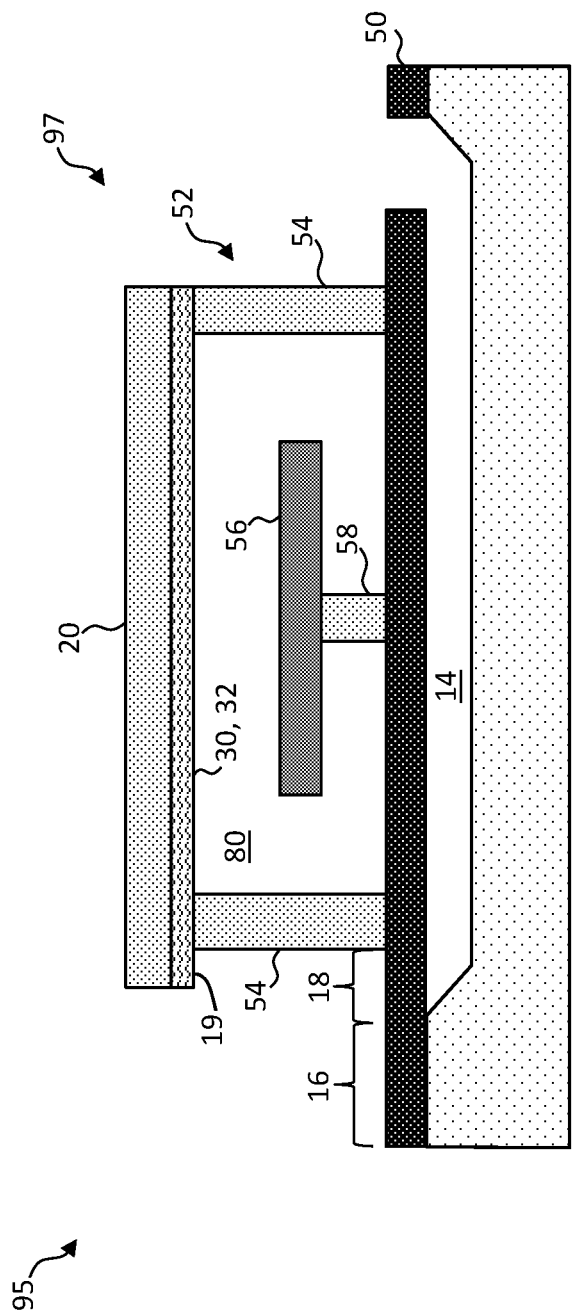
FIG. 7 is a cross section of a module source wafer according to illustrative embodiments of the present disclosure.

Adhesive 31 can be a curable adhesive and can be cured in step 160, for example by exposing adhesive 31 to radiation 74 (e.g., such as ultra-violet radiation from a radiation source such as an ultra-violet lamp) or heat (e.g., from a resistive heater), as shown in FIG. 5K, to form a layer 30 of cured adhesive 32, as shown in FIG. 5L. (Note that FIG. 5L is similar to FIG. 2.) Referring to FIG. 7, in addition to component 20, cavity structures 52 (e.g., piezo-electric device 56) can be disposed on destination substrate 50 by printing (e.g., micro-transfer printing) to form cavity 80. In FIG. 7, destination substrate 50 is a substrate for module 97. Module 97 is attached to anchor 16 of module source wafer 95 by tether 18. Module 97 can be micro-transfer printed to a second destination substrate 50.

Figure 9:
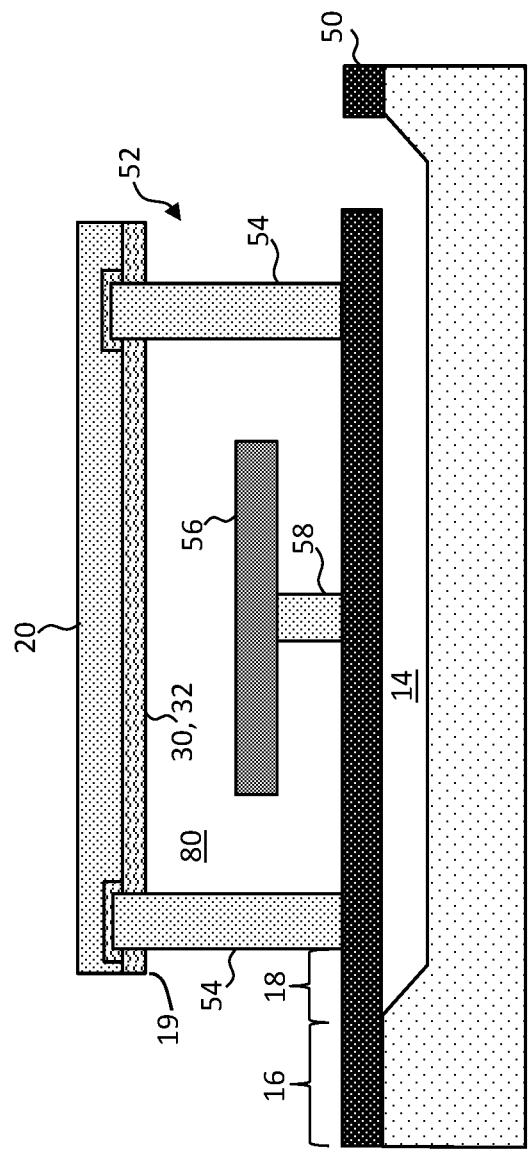
FIG. 9 is a cross section of illustrative embodiments of the present disclosure.

In some embodiments, component 20 is a planar cap for cavity 80. For example, FIGS. 1, 2, 5A-5L, 7, and 8A show embodiments where component 20 is a planar cap. In some embodiments, component 20 is a non-planar cap for cavity 80. For example, FIGS. 8B-8E show non-planar caps. Component 20 can be non-planar on any one or more of its sides. Component 20 can have a planar side and an opposing non-planar side. Component 20 can comprise a notch 21, for example provided on one side of component 20. Notch 21 can have a rectangular (FIGS. 8B, 8C), triangular (FIGS. 8D, 8E), or trapezoidal cross section, or can have other cross sections. Notch 21 can be positioned between two or more protrusions of component 20, for example as shown in FIGS. 8B and 8D. Notch 21 can be recessed into a surface of component 20, for example as shown in FIGS. 8C and 8E. Notch 21 can have a narrow side or a wide side, for example a narrow side can be closer to an opposing side of component 20 than a wide side. Notch 21 can be designed and shaped to mate with a structure onto which component 20 is disposed, for example a structure disposed (e.g., formed) on destination substrate 50, such as one or more cavity walls 54, for example as shown in FIG. 9. Notch 21 can extend around or adjacent to a perimeter of a side of component 20 so that notch 21 can assist in locating component 20 on one or more cavity walls 54 and in encapsulating cavity 80. In some embodiments, component 20 is not a cap, but is another structure, device, or element that is usefully adhered to a destination substrate 50 by a layer 30 of adhesive 31 applied to back side 22 of component 20, either within cavity 80 or not within cavity 80.

Reference is made throughout the present description to examples of micro-transfer printing with stamp 40 when describing certain examples of printing components 20. Similar other embodiments are expressly contemplated where a transfer device that is not a stamp 40 is used to similarly print components 20. For example, in some embodiments, a transfer device that is a vacuum-based or electrostatic transfer device can be used to print components 20. A vacuum-based or electrostatic transfer device can comprise a plurality of transfer posts, each transfer post being constructed and arranged to pick up a single component 20 (similarly to stamp posts 42 in stamp 40).

According to some embodiments, micro-transfer printing can include any method of transferring components 20 from a source substrate (e.g., wafer substrate 10) to a destination substrate 50 by contacting components 20 on wafer substrate 10 (component source substrate) with a patterned or unpatterned stamp surface of a stamp 40 to remove components 20 from the source substrate, transferring stamp 40 and contacted components 20 to destination substrate 50, and contacting components 20 to a surface of destination substrate 50. Components 20 can be adhered to stamp 40 or destination substrate 50 by, for example, any one or combination of van der Waals forces, electrostatic forces, and magnetic forces. In some embodiments, components 20 are adhered to stamp 40 with separation-rate-dependent adhesion, for example kinetic control of visco-elastic stamp materials such as can be found in elastomeric transfer devices such as a PDMS stamp 40. Stamps 40 can be patterned (e.g., having stamp posts 42) or unpatterned (e.g., planar). Stamps 40 can comprise stamp posts 42 having a stamp post area on the distal end of stamp posts 42. Stamp posts 42 can have a length, a width, or both a length and a width, similar or substantially equal to a length, a width, or both a length and a width of component 20. In some embodiments, stamp posts 42 can be smaller than components 20 or have a dimension, such as a length and/or a width, substantially equal to or smaller than a length or a width of component 20. In some embodiments, stamp posts 42 each have a contact surface of substantially identical area with components 20.

In exemplary methods, a viscoelastic elastomer (e.g., PDMS) stamp 40 (e.g., comprising a plurality of stamp posts 42) is constructed and arranged to retrieve and transfer arrays of components 20 from their native wafer substrate 10 onto non-native destination substrates 50. In some embodiments, stamp 40 mounts onto motion-plus-optics machinery (e.g., an opto-mechatronic motion platform) that can precisely control stamp 40 alignment and kinetics with respect to both wafer substrates 10 and destination substrates 50. During micro-transfer printing, the motion platform brings stamp 40 into contact with components 20 on wafer substrate 10, with optical alignment performed before contact. Rapid upward movement of the print-head (or, in some embodiments, downward movement of wafer substrate 10) fractures or separates component tether(s) 18 forming fractured or separated component tethers 19, transferring component(s) 20 to stamp 40 or stamp posts 42. The populated stamp 40 then travels to destination substrate 50 (or vice versa) and one or more components 20 are then aligned to destination substrate 50 and one or more cavity structures 52 (if present) and printed.

A wafer substrate 10 can be any source wafer or substrate with transfer printable components 20 that can be transferred with a transfer device (e.g., a stamp 40). For example, a wafer substrate 10 can be or comprise a semiconductor (e.g., silicon) in a crystalline or non-crystalline form, a compound semiconductor (e.g., comprising GaN or GaAs), a glass, a polymer, a sapphire, or a quartz wafer. Sacrificial portions of sacrificial layer 12 can be formed of a patterned oxide (e.g., silicon dioxide) or nitride (e.g., silicon nitride) layer or can be an anisotropically etchable portion of sacrificial layer 12 of wafer substrate 10. Typically, wafer substrates 10 are smaller than destination substrates 50.

Components 20 can be any transfer printable structure, for example including any one or more of a wide variety of active or passive (or active and passive) components 20. Components 20 can be any one or more of integrated devices, integrated circuits (such as CMOS circuits), light-emitting diodes, photodiodes, sensors, electrical or electronic devices, optical devices, opto-electronic devices, magnetic devices, magneto-optic devices, magneto-electronic devices, and piezo-electric device, materials or structures. Components 20 can comprise electronic component circuits that operate component 20. Component 20 can be responsive to electrical energy, to optical energy, to electromagnetic energy, or to mechanical energy, for example. In some embodiments, component 20 is a passive dielectric cap for use in forming cavity 80.

Components 20 formed or disposed in or on wafer substrates 10 can be constructed using integrated circuit, micro-electro-mechanical, or photolithographic methods for example. Components 20 can comprise one or more different component materials, for example non-crystalline (e.g., amorphous), polycrystalline, or crystalline semiconductor materials such as silicon or compound semiconductor materials or non-crystalline or crystalline piezo-electric materials.

In certain embodiments, components 20 can be native to and formed on sacrificial portions of sacrificial layer 12 and can include seed layers for constructing crystalline layers on or in wafer substrates 10. Components 20, recessed portions 14, anchors 16, and component tethers 18 can be constructed, for example using photolithographic processes. Components 20 can be micro-devices having at least one of a length and a width less than or equal to 200 microns (e.g., less than or equal to 100 microns, less than or equal to 50 microns, less than or equal to 25 microns, less than or equal to 15 microns, less than or equal to 10 microns, or less than or equal to five microns), and alternatively or additionally a thickness of less than or equal to 50 microns (e.g., less than or equal to 25 microns, less than or equal to 15 microns, less than or equal to 10 microns, less than or equal to five microns, less than or equal to two microns, or less than or equal to one micron). Components 20 can be unpackaged dice (each an unpackaged die) transferred directly from native wafer substrates 10 on or in which components 20 are constructed to destination substrate 50 or structures formed on or comprised by destination substrate 50.

Anchors 16 and component tethers 18 can each be or can comprise portions of wafer substrate 10 that are not sacrificial portions of sacrificial layer 12 of wafer substrate 10 and can include layers formed on wafer substrates 10, for example dielectric or metal layers and for example layers formed as a part of photolithographic processes used to construct or encapsulate components 20.

Destination substrate 50 can be any destination or target substrate to which components 20 are transferred (e.g., micro-transfer printed), for example flat-panel display substrates, printed circuit boards, or similar substrates can be used in various embodiments. Destination substrates 50 can be, for example substrates comprising one or more of glass, polymer, quartz, ceramics, metal, and sapphire. Destination substrates 50 can include dielectric materials. Destination substrates 50 can be semiconductor substrates (for example silicon) or compound semiconductor substrates.

Patterned electrical conductors (e.g., wires, traces, or electrodes (e.g., electrical contact pads) such as those found on printed circuit boards, flat-panel display substrates, and in thin-film circuits) can be formed on any combination of components 20 and destination substrate 50, and any one can comprise electrodes (e.g., electrical contact pads) that electrically connect to components 20. Such patterned electrical conductors and electrodes (e.g., contact pads) can comprise, for example, metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on destination substrate 50.

In some embodiments, cavity structures 52 comprise a piezo-electric material, for example in piezo-electric device 56, such as a piezo-electric transducer or piezo-electric resonator. In some embodiments, a piezo-electric material in cavity structure 52 can be used in an acoustic wave filter or sensor, such as a bulk acoustic wave filter or sensor or a surface acoustic wave filter or sensor.

A material of component 20 can be or include one or more of a semiconductor, a compound semiconductor, a III-V semiconductor, a II-VI semiconductor, or a ceramic (e.g., a synthetic ceramic). For example, a component material can be or include one or more of GaN, AlGaN, AlN, gallium orthophosphate ($GaPO_4$), Langasite ($La_3Ga_5SiO_{14}$), lead titanate, barium titanate ($BaTiO_3$), lead zirconate titanate ($Pb[Zr_xTi_{1-x}]O_3$ $0 \leq x \leq 1$), potassium niobate ($KNbO_3$), lithium niobate ($LiNbO_3$), lithium tantalate ($LiTaO_3$), sodium tungstate ($Na_2WO_3$), $Ba_2NaNb_5O_5$, $Pb_2KNb_5O_{15}$, zinc oxide (ZnO), Sodium potassium niobate (($K,Na)NbO_3$) (NKN), bismuth ferrite ($BiFeO_3$), Sodium niobate (NaNbO3), bismuth titanate ($Bi_4Ti_3O_{12}$), sodium bismuth titanate ($Na_{0.5}Bi_{0.5}TiO_3$), wurtzite, and polyvinylidene fluoride. A component material can be or include a piezo-electric material that exhibits a piezo-electric effect. In some embodiments, component 20 can be processed or formed using photolithographic methods. A component material can be or include a dielectric, for example silicon dioxide, silicon nitride, or a polymer.

Examples of micro-transfer printing processes suitable for disposing components 20 onto destination substrates 50 are described in *Inorganic light-emitting diode displays using micro-transfer printing* (Journal of the Society for Information Display, 2017, DOI #10.1002/jsid.610, 1071-0922/17/ 2510-0610, pages 589-609), U.S. Pat. No. 8,722,458 entitled Optical Systems Fabricated by Printing-Based Assembly, U.S. patent application Ser. No. 15/461,703 entitled Pressure Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743, 788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety. Examples of micro-transfer printed acoustic wave filter devices are described in U.S. patent application Ser. No. 15/047,250, entitled Micro-Transfer Printed Acoustic Wave Filter Device, the disclosure of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound micro-assembly structures and methods can also be used in certain embodiments, for example, as described in U.S. patent application Ser. No. 14/822,868, filed Aug. 10, 2015, entitled Compound Micro-Assembly Strategies and Devices, which is hereby also incorporated by reference in its entirety.

According to various embodiments, wafer substrate 10 can be provided with components 20, patterned recessed portions 14, component tethers 18, and anchors 16 already formed, or they can be constructed as part of a method in accordance with certain embodiments. Wafer substrate 10 and components 20, micro-transfer printing device (e.g., a stamp 40), and destination substrate 50 can be made separately and at different times or in different temporal orders or locations and provided in various process states. Likewise, layer 30 of adhesive 31 can be cured before or after stamp 40 is removed from destination substrate 50 (for example as shown in FIG. 5K).

Because components 20, in certain embodiments, can be made using integrated circuit photolithographic techniques having a relatively high resolution and cost and destination substrate 50, for example a printed circuit board, can be made using printed circuit board techniques having a relatively low resolution and cost, electrical conductors destination substrate 50 can be much larger than electrical contacts or component electrodes on component 20, thereby reducing manufacturing costs. For example, in certain embodiments, micro-transfer printable component 20 has at least one of a width, length, and height from 0.5 μm to 200 μm (e.g., 0.5 to 2 μm, 2 to 5 μm, 5 to 10 μm, 10 to 20 μm, 20 to 50 μm, or 50 to 100 μm, or 100 to 200 μm).

In certain embodiments, destination substrate 50 is or comprises a member selected from the group consisting of polymer (e.g., plastic, polyimide, PEN, or PET), resin, metal (e.g., metal foil) glass, a semiconductor, and sapphire. In certain embodiments, a patterned substrate 10 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

Components 20, in certain embodiments, can be constructed using foundry fabrication processes used in the art. Layers of materials can be used, including materials such as metals, oxides, nitrides and other materials used in the integrated-circuit art. Each component 20 can be or include a complete semiconductor integrated circuit and can include, for example, any combination of one or more of a transistor, a diode, a light-emitting diode, and a sensor. Components 20 can have different sizes, for example, at least 100 square microns, at least 1,000 square microns, at least 10,000 square microns, at least 100,000 square microns, or at least 1 square mm. Alternatively or additionally, components 20 can be no more than 100 square microns, no more than 1,000 square microns, no more than 10,000 square microns, no more than 100,000 square microns, or no more than 1 square mm, for example. Components 20 can have variable aspect ratios, for example between 1:1 and 10:1 (e.g., 1:1, 2:1, 5:1, or 10:1). Components 20 can be rectangular or can have other shapes, such as polygonal or circular shapes for example.

Various embodiments of structures and methods were described herein. Structures and methods were variously described as transferring components 20, printing components 20, or micro-transferring components 20. Micro-transfer-printing involves using a transfer device (e.g., an elastomeric stamp 40, such as a PDMS stamp 40) to transfer a component 20 using controlled adhesion. For example, an exemplary transfer device can use kinetic or shear-assisted control of adhesion between a transfer device and a component 20. It is contemplated that, in certain embodiments, where a method is described as including micro-transfer-printing a component 20, other analogous embodiments exist using a different transfer method. As used herein, transferring a component 20 (e.g., from a component source substrate 10 or wafer substrate 10 to a destination substrate 50) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a vacuum tool or other transfer device is used to transfer a component 20.

As is understood by those skilled in the art, the terms "over" and "under" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST

- 10 wafer substrate
- 12 sacrificial layer
- 14 recessed portion
- 16 anchor
- 18 tether/component tether/module tether
- 19 broken component tether
- 20 component/micro-device/cap
- 21 notch
- 22 back side/bottom side
- 24 top side
- 26 active element
- 28 passive element/dielectric layer/encapsulating layer
- 30 layer of adhesive
- 31 adhesive
- 32 cured adhesive
- 40 stamp
- 42 stamp post
- 50 destination substrate
- 52 cavity structure
- 54 cavity wall
- 56 piezo-electric device
- 58 cavity post
- 60 spray coater
- 70 plasma source
- 72 plasma
- 74 radiation
- 80 cavity
- 90 component source wafer structure
- 95 module source wafer
- 97 module
- 100 provide wafer substrate step
- 110 provide component step
- 120 etch sacrificial portions step
- 130 dispose adhesive vapor step
- 140 directional removal step
- 150 micro-transfer print component from wafer substrate to destination substrate step
- 160 cure adhesive step

What is claimed:

1. A component source wafer with printable components having backside adhesive disposed thereon, comprising:
   a wafer substrate comprising a sacrificial layer having recessed portions and anchors;
   a printable component disposed entirely over each recessed portion;
   a tether physically connecting each printable component to at least one of the anchors;

a layer of uncured curable adhesive disposed on a side of the printable component adjacent to the recessed portion;

wherein the printable component is suspended over the wafer substrate by the tether and the recessed portion defines a gap separating the printable component and the layer of uncured curable adhesive from the wafer substrate.

2. The component source wafer of claim 1, wherein the recessed portions are laterally separated by the anchors.

3. The component source wafer of claim 1, wherein a side of the component opposite to the recessed portion has substantially no adhesive disposed thereon.

4. The component source wafer of claim 1, wherein the uncured curable adhesive is radiation or heat curable.

5. The component source wafer of claim 1, wherein the uncured curable adhesive is an epoxy or resin.

6. The component source wafer of claim 1, wherein the component is a cap.

7. The component source wafer of claim 1, wherein the component is a non-planar cap.

8. The component source wafer of claim 1, wherein the component comprises a notch.

9. The component source wafer of claim 1, wherein the component is a micro device.

10. A method of providing a component source wafer with printable components having a backside adhesive layer disposed thereon according to claim 1, the method comprising:

providing a wafer substrate comprising a sacrificial layer comprising recessed portions and anchors;

providing, for each of the recessed portions, a printable component disposed entirely over the recessed portion, wherein the printable component is suspended over the recessed portion by at least one tether physically connecting the printable component to at least one of the anchors and the recessed portion defines a gap separating the printable component from the wafer substrate; and disposing a layer of uncured curable adhesive on a side of the printable component adjacent to the recessed portion such that the printable component with the layer of uncured curable adhesive remains suspended with the gap defined between the printable component with the layer of uncured curable adhesive and the wafer substrate.

11. The method of claim 10, comprising:
providing a directional removal agent; and
removing adhesive exposed to the removal agent.

12. The method of claim 11, wherein the removal agent is plasma.

13. The method of claim 12, wherein the removal agent is $O_2$ plasma.

14. The method of claim 10, wherein the disposition of the layer of uncured curable adhesive is a substantially non-directional disposition.

15. The method of claim 10, wherein the step of disposing an adhesive layer comprises providing a gas, vapor, or mist of adhesive.

16. The method of claim 10, wherein the step of disposing the adhesive comprises spraying the uncured curable adhesive.

17. The method of claim 10, wherein the step of disposing the layer of uncured curable adhesive comprises depositing a layer of material using atomic layer deposition.

18. The method of claim 10, comprising:
providing the wafer substrate comprising the sacrificial layer, wherein the sacrificial layer comprises sacrificial portions; and
etching the sacrificial portions to separate the components from the wafer substrate by a gap.

19. The method of claim 10, comprising:
providing a stamp;
contacting the one or more components with the stamp to reversibly adhere the components to the stamp; and
removing the stamp and adhered components from the wafer substrate, thereby fracturing the tethers.

20. The method of claim 19 comprising:
providing a destination substrate; and
contacting the one or more components to the destination substrate with the stamp to adhere the one or more components to the destination substrate with the layer of adhesive.

21. The method of claim 20, wherein the layer of adhesive consists essentially of uncured curable adhesive and comprising curing the uncured curable adhesive after contacting the component to the destination substrate with the stamp.

22. The method of claim 21, comprising:
removing the stamp from the components and from the destination substrate; and
curing the uncured curable adhesive after removing the stamp.

23. The method of claim 21, comprising:
curing the uncured curable adhesive before removing the stamp; and
removing the stamp from the components and from the destination substrate.

* * * * *